United States Patent
Hiroshima et al.

(10) Patent No.: US 9,148,958 B2
(45) Date of Patent: Sep. 29, 2015

(54) CIRCUIT BOARD AND ELECTRONIC DEVICE

(71) Applicant: FUJITSU LIMITED, Kawasaki-shi, Kanagawa (JP)

(72) Inventors: Yoshiyuki Hiroshima, Kawasaki (JP); Akiko Matsui, Kawasaki (JP); Mitsuhiko Sugane, Kawasaki (JP); Takahide Mukoyama, Kawasaki (JP); Tetsuro Yamada, Kawasaki (JP); Takahiro Ooi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/587,556

(22) Filed: Dec. 31, 2014

(65) Prior Publication Data

US 2015/0116962 A1 Apr. 30, 2015

Related U.S. Application Data

(62) Division of application No. 13/300,701, filed on Nov. 21, 2011, now Pat. No. 8,958,211.

(30) Foreign Application Priority Data

Jan. 25, 2011 (JP) .................. 2011-013309

(51) Int. Cl.
*H05K 7/00* (2006.01)
*H05K 1/18* (2006.01)

(52) U.S. Cl.
CPC .................. *H05K 1/181* (2013.01); *H05K 1/18* (2013.01); *H05K 2201/099* (2013.01)

(58) Field of Classification Search
USPC .................................................. 361/760, 761
See application file for complete search history.

(56) References Cited

U.S. PATENT DOCUMENTS 4,767,892 A 8/1988 Kobari
5,400,948 A * 3/1995 Sajja et al. ................. 228/180.1
(Continued)

FOREIGN PATENT DOCUMENTS

EP     0 696 159 A1   2/1996
JP     01-217994      8/1989
(Continued)

OTHER PUBLICATIONS

Office Action dated Oct. 28, 2014, issued in corresponding Japan Patent Application No. 2011-013309. No copy provided, per MPEP 609. Submitted in parent U.S. Appl. No. 13/300,701.
(Continued)

*Primary Examiner* — Andargie M Aychillhum
(74) *Attorney, Agent, or Firm* — Squire Patton Boggs (US) LLP

(57) ABSTRACT

An electronic device includes an electronic component including a plurality of terminals and a circuit board on which the electronic component is mounted. The circuit board includes a board body, a plurality of electrode pads arranged on the board body, each of the electrode pads being connected to each of the terminals by solder, a first solder resist formed on the board body and having a plurality of first openings, each of the first openings accommodating each of the electrode pads, and a second solder resist formed on the first solder resist and having a plurality of second openings, each of the second openings being larger than each of the first openings and communicating with each of the first openings.

2 Claims, 13 Drawing Sheets

(56) References Cited

U.S. PATENT DOCUMENTS

| 2007/0175657 A1 | 8/2007 | Itoh |
| 2007/0184675 A1 | 8/2007 | Ishikawa |
| 2010/0046185 A1 | 2/2010 | Hirasawa |

FOREIGN PATENT DOCUMENTS

| JP | 08-186361 A | 7/1996 |
| JP | 10-256715 A | 9/1998 |
| JP | 10-335798 | 12/1998 |
| JP | 2005-159102 A | 6/2005 |
| JP | 2007-059530 A | 3/2007 |
| JP | 2008-311538 A | 12/2008 |

OTHER PUBLICATIONS

Office Action dated May 27, 2014, issued in corresponding Japan Patent Application No. 2011-013309. No copy provided, per MPEP 609. Submitted in parent U.S. Appl. No. 13/300,701.

European Search Report application No. 11191173.1 dated Jul. 2, 2012. No copy provided, per MPEP 609. Submitted in parent U.S. Appl. No. 13/300,701.

Office Action dated Jun. 23, 2015, issued in corresponding JP Patent Application No. 2011-013309 (with English translation).

* cited by examiner

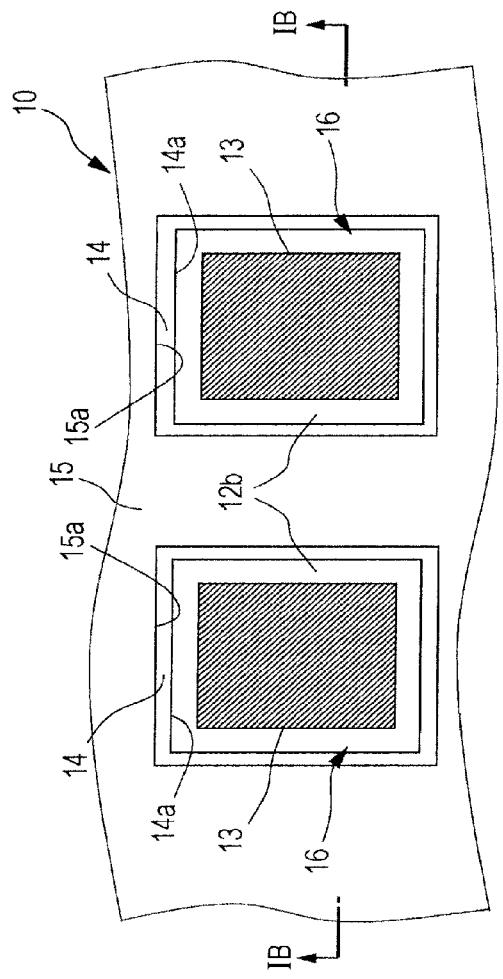
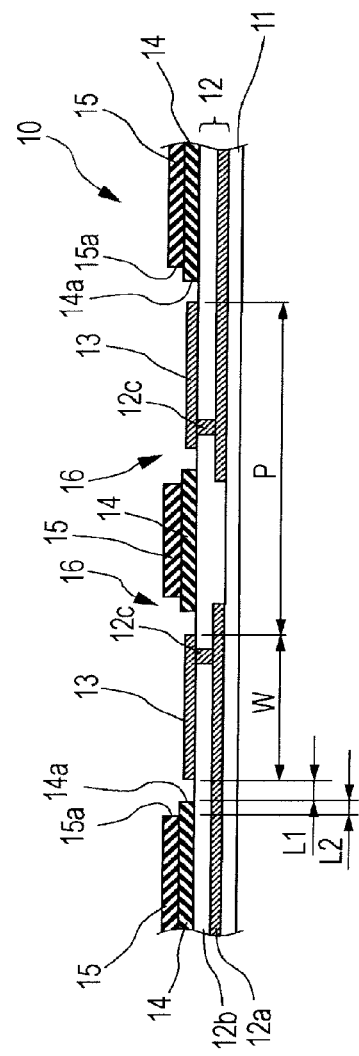
FIG. 1A
FIG. 1B

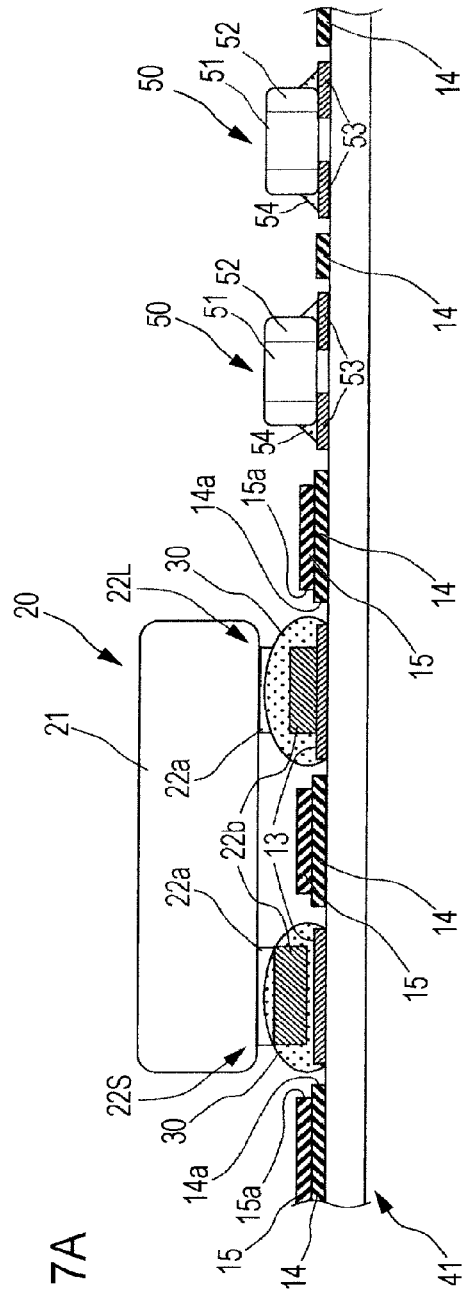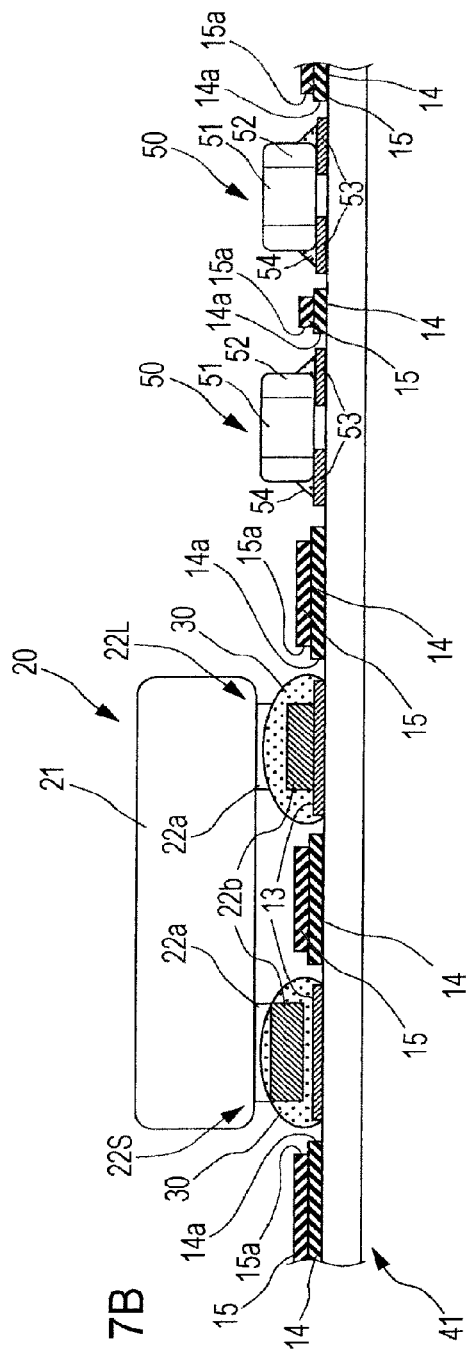

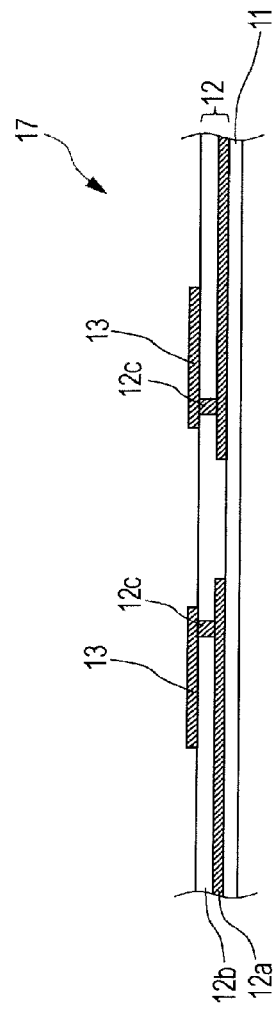
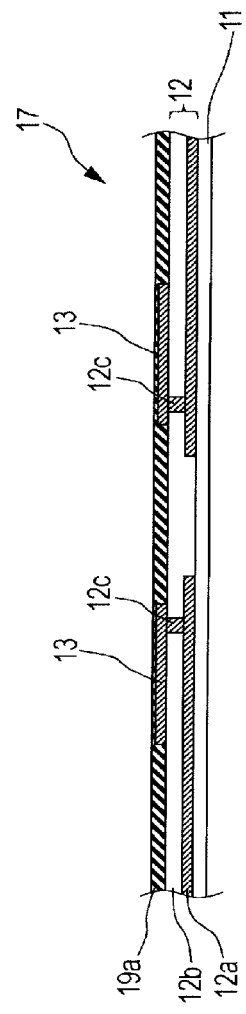
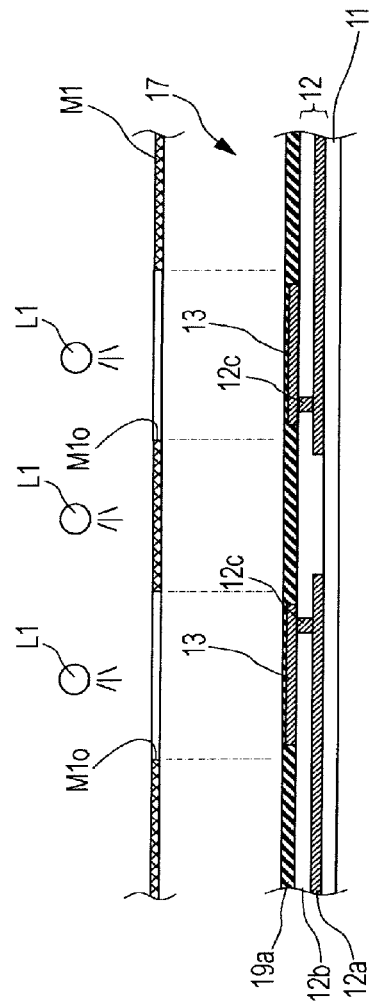
FIG. 8A
FIG. 8B
FIG. 8C

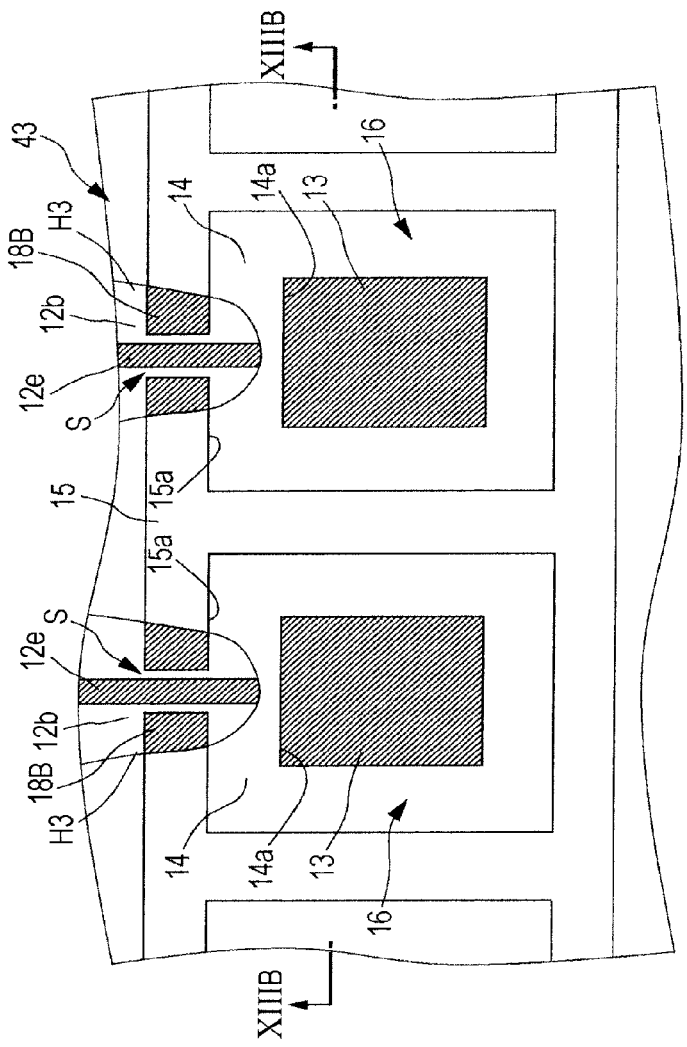
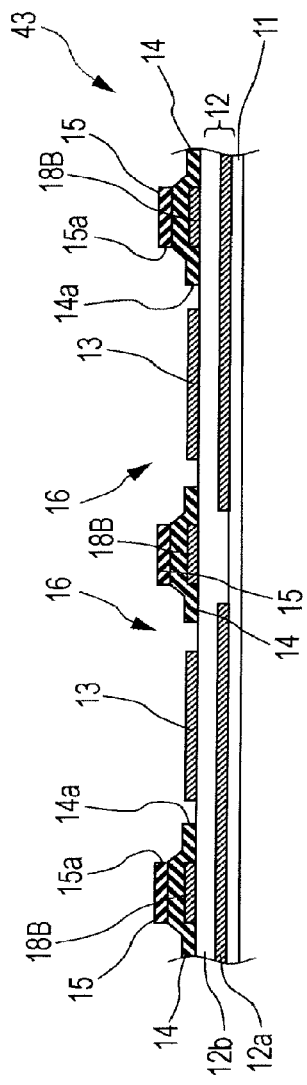
FIG. 13A
FIG. 13B

CIRCUIT BOARD AND ELECTRONIC DEVICE

CROSS-REFERENCE TO RELATED APPLICATION

This is a divisional of U.S. patent application Ser. No. 13/300,701 filed Nov. 21, 2011, which claims the benefit of priority of the prior Japanese Patent Application No. 2011-013309, filed on Jan. 25, 2011, the entire contents of which are incorporated herein by reference.

FIELD

The embodiment discussed herein is related to a circuit board and an electronic device.

BACKGROUND

For example, a circuit board that is arranged in an electronic device has a board body, electrode pads arranged on a surface of the board body, and a solder resist. The solder resist is arranged on the surface of the board body, has openings formed at positions corresponding to the electrode pads, and serves as a protective film. The solder resist has a function of preventing a solder material supplied onto the electrode pads from spreading onto the circuit board when the solder material is melted. The solder resist also has a function of protecting the surface of the circuit board.

In order to supply solder paste onto the electrode pads of the circuit board, a so-called printing method is used in some cases. In the printing method, while a solder mask (printing plate) is placed on the solder resist of the circuit board, the solder paste is supplied onto the electrode pads located in the openings of the solder resist through mask openings formed in the solder mask.

In order to mount an electronic part on the circuit board, lead terminals of the electronic part are placed on the solder paste supplied onto the electrode pads of the circuit board, and the solder paste is heated in a reflow furnace. When the solder paste is melted, the lead terminals of the electronic part, which are placed on the solder paste, sink into the solder paste owing to the weight of the electronic part. This causes the lead terminals of the electronic part to be bonded to the electrode pads of the circuit board by a solder material contained in the solder paste and to be electrically connected to the electrode pads.

A related-art document is a Japanese Laid-open Patent Publication No. 10-335798.

The heights of the lead terminals of the electronic part are not necessarily equal to each other. The circuit board or the electronic part is not necessarily formed in a shape according to design. In addition, deformations such as warpage may occur in the circuit board and the electronic part. Thus, a "variation" in interval between the electrode pads and the lead terminals normally occur.

When the amount of the solder paste supplied onto the electrode pads is small, and the electronic part sinks into the solder paste owing to the melt of the solder paste, the solder paste may not accommodate a "variation" in interval between the electrode pads and the lead terminals, and a connection between at least one of the lead terminals and the interested electrode pad may fail. Especially, in recent years, the sizes of electrode pads have tended to be reduced in conjunction with a reduction in a pitch of the electrode pads (and lead terminals). Thus, the amount of the solder paste to be supplied onto the electrode pads has been reduced. Therefore, the connections between the electrode pads and the lead terminals may easily fail.

In order to reduce the rate of the occurrence of a failure of the connections between the electrode pads and the lead terminals, the thickness of the solder mask is increased, for example, from 150 µm to 200 µm, and the amount of the solder paste to be supplied onto the electrode pads is increased in some cases. However, when the thickness of the solder mask is increased and the solder mask is removed from the circuit board, the solder paste may remain in the mask openings, and a sufficient amount of the solder paste cannot be supplied onto the electrode pads, or the sufficient amount of the solder paste cannot be supplied onto the electrode pads, and the solder paste cannot accommodate a variation in height of the lead terminals.

In order to increase the amount of the solder paste to be supplied onto the electrode pads without an increase in the thickness of the solder mask, it can be considered that the sizes of the openings that are formed in the solder resist at the positions corresponding to the electrode pads are increased, for example. However, the increases in the sizes of the openings that are formed in the solder resist are limited in consideration of the fact that the solder resist has the function of protecting the circuit board.

In addition, in order to increase the amount of the solder paste to be supplied onto the electrode pads without an increase in the thickness of the solder mask, it can be considered that the thickness of the solder resist is increased so that the depths of the openings that are formed in the solder resist at the positions corresponding to the electrode pads are increased, for example. However, when the thickness of the solder resist is increased, the thickness of the solder paste supplied onto the electrode pads is also increased. Thus, when the lead terminals of the electronic part sink into the solder paste, a large amount of the solder that exists in the openings may flow onto the circuit board, and a so-called solder bridge may be formed.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

SUMMARY

According to an aspect of the invention, an electronic device includes an electronic component including a plurality of terminals, and a circuit board on which the electronic component is mounted, wherein the circuit board includes a board body, a plurality of electrode pads arranged on the board body, each of the electrode pads being connected to each of the terminals by solder, a first solder resist formed on the board body and having a plurality of first openings, each of the first openings accommodating each of the electrode pads, and a second solder resist formed on the first solder resist and having a plurality of second openings, each of the second openings being larger than each of the first openings and communicating with each of the first openings.

BRIEF DESCRIPTION OF DRAWINGS

FIGS. 1A and 1B are outline diagrams illustrating a circuit board according to a first embodiment.

FIGS. 7A and 7B are outline diagrams illustrating an electronic device according to a third embodiment.

FIGS. 8A to 8C are diagrams illustrating a process of manufacturing a circuit board according to a fourth embodiment.

FIGS. 13A and 13B are outline diagrams illustrating a circuit board according to a sixth embodiment.

DESCRIPTION OF EMBODIMENTS

[First Embodiment]

Figure 2A:
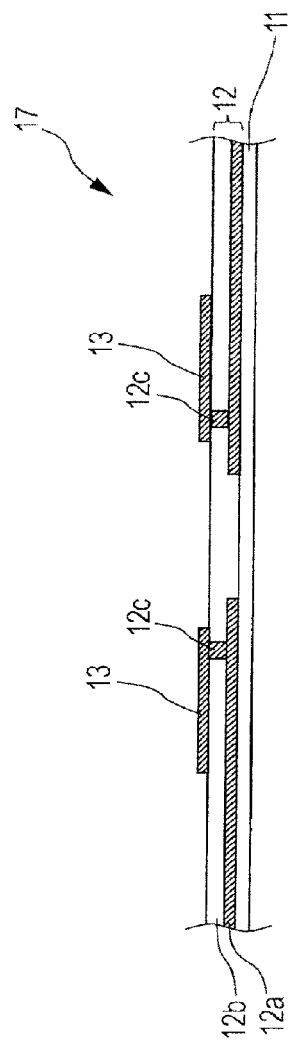
FIGS. 2A to 2C are diagrams illustrating a process of manufacturing the circuit board according to the first embodiment.

First, a first embodiment is described with reference to FIGS. 1A to 5B.

(Configuration of Circuit Board 10)

FIG. 1A is an outline diagram illustrating a circuit board 10 according to the first embodiment, and illustrates a surface of the circuit board 10. FIG. 1B is an outline diagram illustrating the circuit board 10 according to the first embodiment, and illustrates a cross section of the circuit board 10, taken along line IB-IB illustrated in FIG. 1A.

As illustrated in FIGS. 1A and 1B, the circuit board 10 includes a substrate 11, a wiring multilayer 12, electrode pads 13, a first solder resist 14 and a second solder resist 15. The type of the circuit board 10 is not limited. For example, a printed board or a ceramic board may be used as the circuit board 10.

The substrate 11 is formed in a rectangular shape in plan view. When the circuit board 10 is a printed board, a material that is formed by impregnating an epoxy resin with a glass fiber is used as a material of the substrate 11, for example. When the circuit board 10 is a ceramic board, alumina ceramics or the like is used as the material of the substrate 11, for example.

The wiring multilayer 12 includes a wiring pattern 12a, an insulating layer 12b and vias 12c. The wiring pattern 12a is arranged on the substrate 11. The insulating layer 12b is arranged on the wiring pattern 12a. The vias 12c are embedded in the insulating layer 12b and electrically connect the wiring pattern 12a to the electrode pads 13. The wiring pattern 12a is formed by patterning a metal foil (or the like) attached to a surface of the substrate 11. Metal such as copper or aluminum may be used as a material of the wiring pattern 12a, for example. An epoxy resin, a polyimide resin or the like may be used as a material of the insulating layer 12b, for example. Metal such as copper or aluminum may be used as a material of each of the vias 12c.

The electrode pads 13 are arranged in a matrix form on the insulating layer 12b of the wiring multilayer 12. The electrode pads 13 are each formed in a rectangular shape in plan view, for example. Lead terminals 22S and 22L of an electronic part 20 (described later) are connected to front surfaces of the electrode pads, respectively. Metal such as copper may be used as a material of each of the electrode pads 13. A plated layer of nickel, gold or the like may be formed on the front surfaces (including peripheral surfaces) of the electrode pads 13. The thicknesses of the electrode pads 13 are in a range of 40 μm to 60 μm, for example. A pitch P of the electrode pads 13 corresponds to a pitch of the lead terminals 22S and 22L of the electronic part 20 (described later) and is in a range of 1.0 mm to 1.27 mm, for example. However, the pitch P of the electrode pads 13 according to the present embodiment is not limited to the aforementioned range. The pitch P of the electrode pads 13 may be in a range of 0.4 mm to 1.0 mm and correspond to the pitch of the lead terminals 22S and 22L of the electronic part 20. The widths W (in a direction in which the electrode pads 13 are arranged at the pitch P) of the electrode pads 13 are in a range of 0.1 mm to 0.4 mm, for example. However, the widths W of the electrode pads 13 may be less than 0.1 mm depending on the pitch P of the electrode pads 13.

The first and second solder resists 14 and 15 are used as a surface protective film for protecting the surface of the circuit board 10. The first and second solder resists 14 and 15 have a function of protecting the surface of the circuit board 10 and a function of preventing a solder material melted on the electrode pads 13 from spreading onto the circuit board 10.

The first solder resist 14 is arranged on the insulating layer 12b of the wiring multilayer 12 and has first openings 14a at positions corresponding to the electrode pads 13. The first openings 14a surround the electrode pads 13, respectively. The underlying insulating layer 12b is exposed from gaps between the electrode pads 13 and the first openings 14a. In the present embodiment, the circuit board 10 has regions in which the first solder resist 14 does not exist around circumferences of the electrode pads 13 so that side surfaces of the electrode pads 13 are exposed. Thus, a solder member 30 (described later) can be bonded to the front surfaces of the electrode pads 13 and the side surfaces of the electrode pads 13. Since the first solder resist 14 has a function of protecting the wiring multilayer 12, the first solder resist 14 cannot be located significantly far from the electrode pads 13. Thus, distances L1 between the side surfaces of the electrode pads 13 and inner surfaces of the first openings 14a are set to a range of 50 μm to 100 μm, for example. The shapes of the first openings 14a may correspond to the shapes of the electrode pads 13. A thermosetting resin or a photosensitive resin is a material of each of the first solder resist 14, for example. The thickness of the first solder resist 14 is in a range of 1 μm to 45 μm, for example.

The second solder resist 15 is arranged on the first solder resist 14 and has second openings 15a at positions corresponding to the electrode pads 13 or the first openings 14a. The second openings 15a surround the electrode pads 13 and the first openings 14a, respectively. The first solder resist 14 is exposed from the second openings 15a. Specifically, the first solder resist 14 extends to inner sides of the second openings 15a of the second solder resist 15. Thus, solder storing regions 16 that are defined by the first and second openings 14a and 15a are formed around the electrode pads 13. Solder paste P is stored in the solder storing regions 16 in a process of manufacturing an electronic device (described later). Distances L2 between the inner surfaces of the first openings 14a and inner surfaces of the second openings 15a are determined by a necessary volume of the solder paste P, internal volumes of mask openings Mso of a solder mask Ms, internal volumes of the first openings 14a, the volumes of the electrode pads 13 and the like. In the present embodiment, the distances L2 are set to a range of 10 µm to 100 µm, for example. The shapes of the second openings 15a may correspond to the shapes of the first openings 14a, for example. A material of the second solder resist 15 is not limited. However, a resin material such as a thermosetting resin or a photosensitive resin, an ink material that is used for serigraph to be performed for marking on the board, or a tape material such as a polyimide tape or a kapton tape, may be used as the material of the second solder resist 15, as long as the material of the second solder resist 15 has an insulation property and a flame retardant property. Thus, examples of the material of the second solder resist 15 are materials (such as a resin material, an ink material and a tape material) that each have an insulation property and a flame retardant property. The material of the second solder resist 15 may be different from the material of the first solder resist 14. The thickness of the second solder resist 15 is equal to or close to the thickness of the first solder resist 14 and in a range of 1 µm to 45 µm, for example. The distances L2 between the inner surfaces of the first openings 14a and the inner surfaces of the second openings 15a may be determined so that at least a part of the second solder resist 15 exists between the electrode pads 13 that are adjacent to each other. In the present embodiment, the distances L2 are in a range of 50 µm to 200 µm, for example.

As described above, in the present embodiment, the thicknesses of the first and second solder resists 14 and 15 are each in a range of 1 µm to 45 µm. However, if the total thickness of the first and second solder resists 14 and 15 is smaller than 10 µm, the surface of the circuit board may be exposed and the circuit board may not be protected. In addition, if the total thickness of the first and second solder resists 14 and 15 is larger than 50 µm, there is a higher possibility that a large amount of the solder paste P flows out of the solder storing regions 16 when the electronic part 20 (described later) sinks so that a solder bridge is formed between the electrode pads 13. Thus, the thicknesses of the first and second solder resists 14 and 15 are set so that the total thickness of the first and second solder resists 14 and 15 is in a range of 10 µm to 50 µm.

(Process of Manufacturing Circuit Board 10)

Figure 2B:
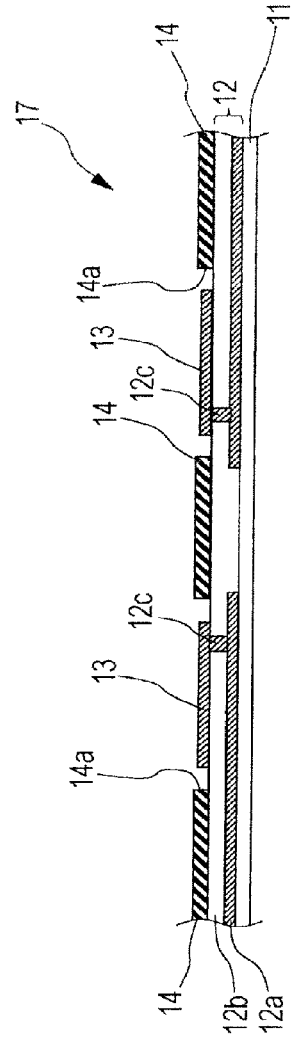
Figure 2C:
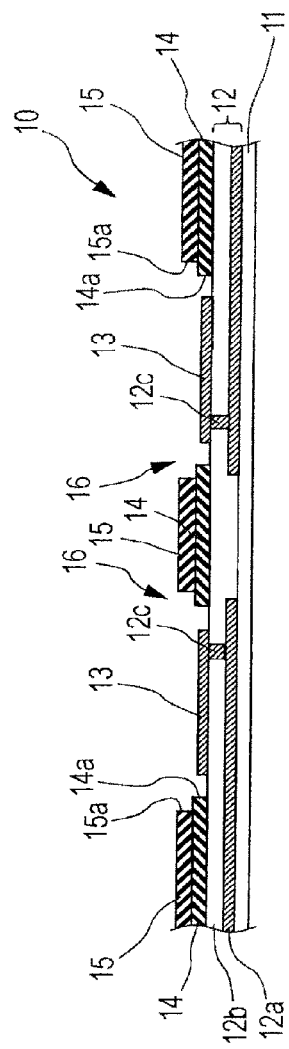

FIGS. 2A to 2C are diagrams illustrating a process of manufacturing the circuit board 10 according to the first embodiment.

As illustrated in FIG. 2A, a board 17 is first prepared. The board 17 is formed by removing the first and second solder resists 14 and 15 from the circuit board 10.

Next, as illustrated in FIG. 2B, the first solder resist 14 that has the first openings 14a is formed on a surface of the board 17. As a method for forming the first solder resist 14, a printing method such as screen printing may be used. A mask for printing the first solder resist 14 is a so-called screen to be placed on the board 17 and has mask regions. The mask regions are each formed in a shape corresponding to each of the first openings 14a of the first solder resist 14 and each have a size corresponding to each of the first openings 14a of the first solder resist 14. After the first solder resist 14 is formed, the first solder resist 14 may be hardened by heating, for example.

Next, as illustrated in FIG. 2C, the second solder resist 15 that has the second openings 15a is formed on the first solder resist 14. Thus, the solder storing regions 16 that are defined by the first and second openings 14a and 15a are formed around the electrode pads 13. After the second solder resist 15 is formed, the second solder resist 15 may be hardened by heating, for example. When the first solder resist 14 is already hardened, the second solder resist 15 is not distorted during the formation of the second solder resist 15. Thus, the second openings 15a of the second solder resist 15 can be formed with high accuracy. As a method for forming the second solder resist 15, a printing method may be used in the same manner as the method for forming the first solder resist 14, for example. A mask for printing the second solder resist 15 is a so-called screen to be placed on the first solder resist 14 and has mask regions. The mask regions are each formed in a shape corresponding to each of the second openings 15a of the second solder resist 15 and each have a size corresponding to each of the second openings 15a of the second solder resist 15.

The thicknesses of the first and second solder resists 14 and 15 and the distances L1 and L2 depend on the volume of the solder paste P that is supplied onto the electrode pads 13 as described later. Thus, before the first and second solder resists 14 and 15 are formed, it is necessary to measure the variation in height of the lead terminals 22S and 22L of the electronic part 20 and calculate the volume of the solder paste P that can accommodate the variation. When the volume of the solder paste P that can accommodate the variation is calculated, necessary internal volumes of the solder storing regions 16 are determined on the basis of the internal volumes of the mask openings Mso of the solder mask Ms and the volumes of the electrode pads 13. The thicknesses of the first and second solder resists 14 and 15 and the distances L1 and L2 are determined so that the internal volumes of the solder storing regions 16 are ensured.

The circuit board 10 according to the present embodiment is manufactured by the manufacturing process described above.

(Configuration of Electronic Device)

Figure 3:
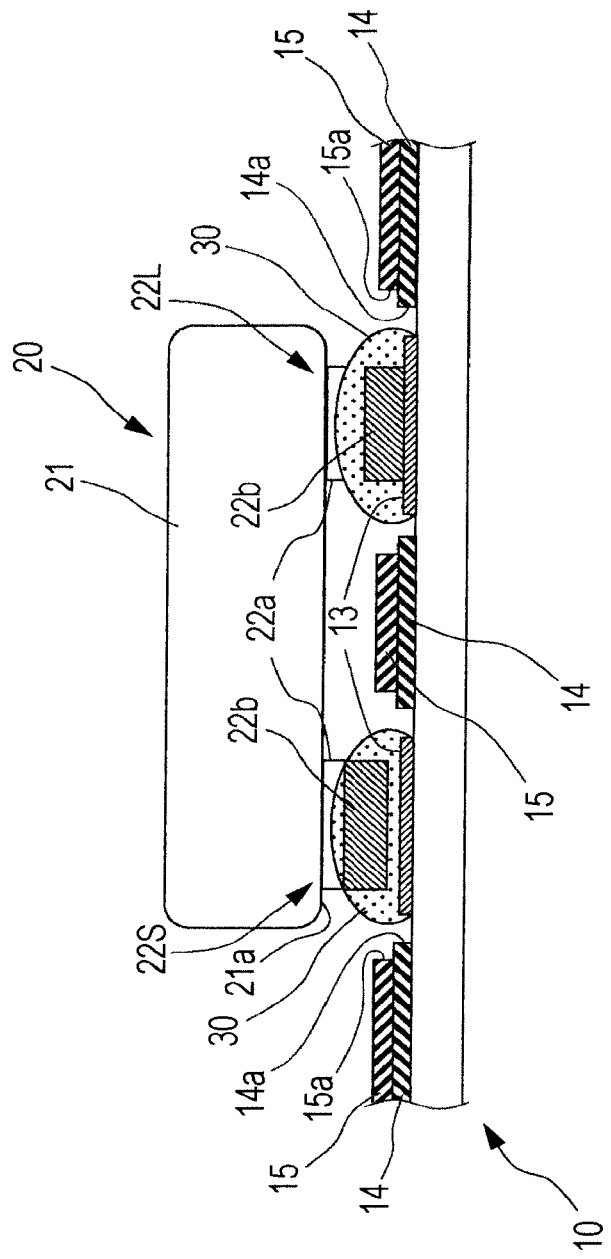
FIG. 3 is an outline diagram illustrating an electronic device according to the first embodiment.

FIG. 3 is an outline diagram illustrating the electronic device according to the first embodiment. In FIG. 3, an illustration of a detailed structure of the circuit board 10 is omitted.

As illustrated in FIG. 3, the electronic device includes the circuit board 10, the electronic part 20 and the solder member 30.

The electronic part 20 is a surface-mounted electronic part and includes a part body 21 and the plurality of lead terminals 22S and 22L. The lead terminals 22S and 22L each include a first extending portion 22a and a second extending portion 22b. The first extending portions 22a extend from a mounting surface 21a of the part body 21 toward the side of the circuit board 10, while the second extending portions 22b extend from the first extending portions 22a in a direction that is parallel to the mounting surface 21a of the part body 21.

In the present embodiment, it is assumed that the electronic part 20 is a board-to-board connector to be installed in an electronic device such as a server or a transmitting device, or is a connector for a dual inline memory module (DIMM) memory to be installed in an electronic device such as a personal computer. Thus, the pitch of the lead terminals 22S and 22L is set to, for example, a range of 1.0 mm to 1.27 mm in the present embodiment.

The lead terminals 22S and 22L of the electronic part 20 described above are connected to the electrode pads 13 of the circuit board 10 through the solder member 30, respectively. Distances (heights) between the mounting surface 21a of the part body 21 and surfaces of the second extending portions 22b of the lead terminals 22S and 22L may be different from each other depending on the lead terminals 22S and 22L. This is caused by a variation in the process of manufacturing the electronic part 20, warpage of the circuit board 10, or warpage of the electronic part 20. Thus, among the lead terminals 22S and 22L of the electronic part 20 mounted on the circuit board 10, the lead terminal 22S that is in contact with the electrode pad 13, and the lead terminal 22L that is not in contact with the electrode pad 13, exist. In the present embodiment, however, since the solder member 30 with an amount sufficient for accommodating the variation in height of the lead terminals is arranged on the electrode pads 13 as described later, the lead terminals 22S and 22L are electrically connected to the electrode pads 13 through the solder member 30, respectively, as illustrated in FIG. 3.

However, the pitch of the lead terminals 22S and 22L according to the present embodiment is not limited to the aforementioned range, and may be in a range of 0.4 mm to 1.0 mm, for example. In addition, the electronic part 20 according to the present embodiment is not limited to the connectors, and may be another electronic part. The type of the terminals of the electronic part 20 is not limited. The terminals of the electronic part 20 may be bump-type terminals or other terminals.

In the present embodiment, the electrode pads 13 are each formed in the rectangular shape in plan view. When a BGA type package is used as the electronic part 20, the electrode pads 13 may be each formed in a circular shape in plan view.

(Method for Manufacturing Electronic Device)

Figure 4A:
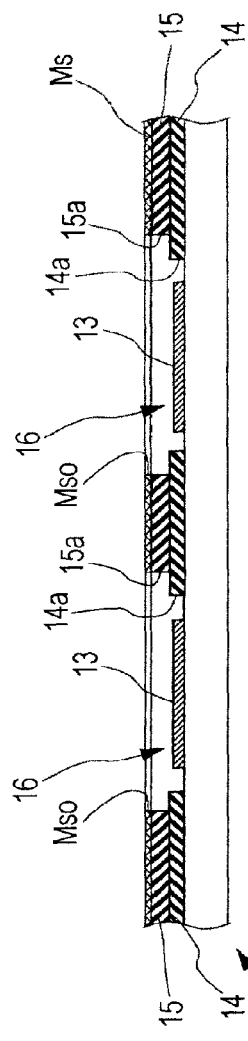
FIGS. 4A to 4C are diagrams illustrating a process of manufacturing the electronic device according to the first embodiment.
Figure 4B:
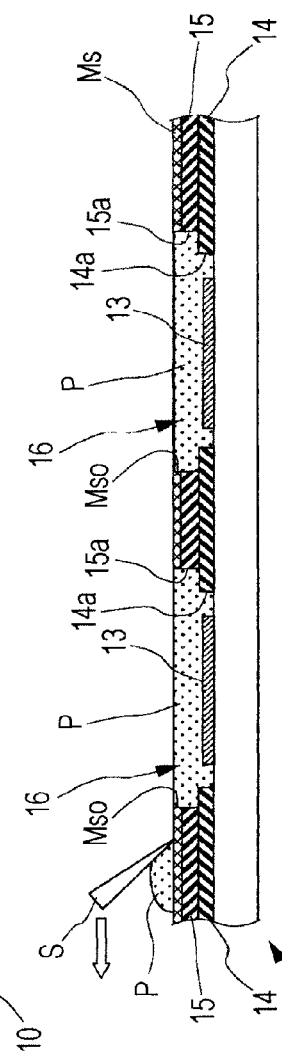
Figure 4C:
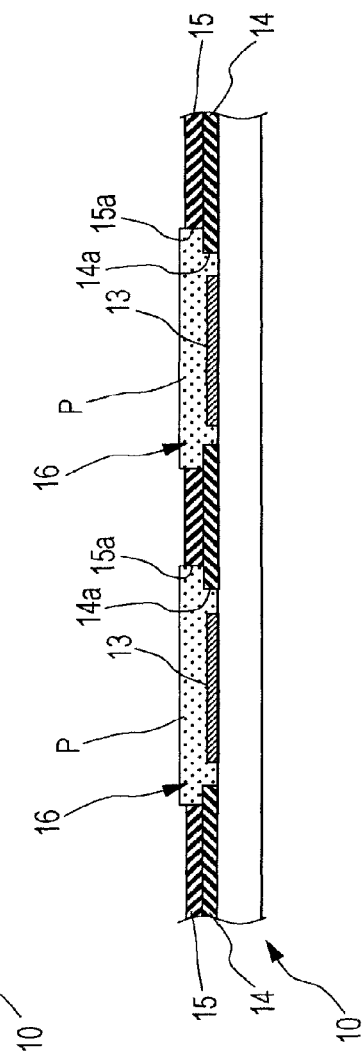
Figures 5A, 5B:
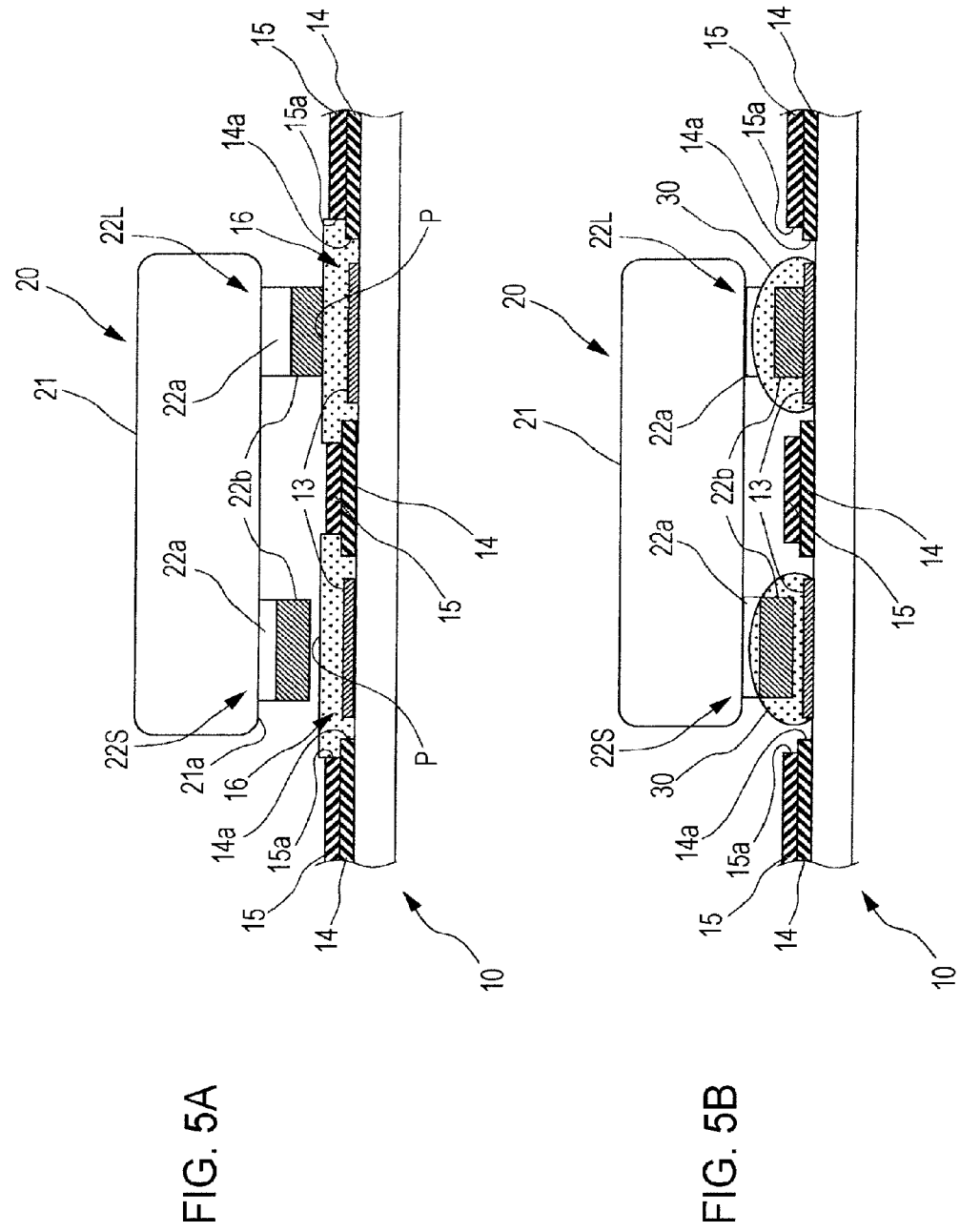
FIGS. 5A and 5B are diagrams illustrating the process of manufacturing the electronic device according to the first embodiment.

FIGS. 4A to 4C are diagrams illustrating a method for manufacturing the electronic device according to the first embodiment. FIGS. 5A and 5B are diagrams illustrating the method for manufacturing the electronic device according to the first embodiment. In FIGS. 4A to 5B, an illustration of a detailed structure of the circuit board 10 is omitted.

First, the solder mask Ms is prepared as illustrated in FIG. 4A. The solder mask Ms is formed by forming the mask openings Mso (to be used to supply the solder paste P) in a flexible metal plate such as stainless or aluminum, for example. The positions, shapes and sizes of the mask openings Mso correspond to the positions, shapes and sizes of the second openings 15a of the second solder resist 15. The thickness of the solder mask Ms is determined on the basis of the amount of the solder paste P (described later) to be supplied. In the present embodiment, the thickness of the solder mask Ms is in a range of 120 μm to 150 μm, for example. The thus-configured solder mask Ms is placed on the circuit board 10.

The amount of the solder paste P to be supplied is determined on the basis of coplanarity of the lead terminals 22S and 22L of the electronic part 20. For example, the amount of the solder paste P to be supplied may be a value obtained by multiplying coplanarity Cp of the lead terminals 22S and 22L by the total area of the electrode pads 13. In addition, the amount of the solder paste P to be supplied may be determined on the basis of the coplanarity Cp of the lead terminals 22S and 22L, warpage of the circuit board 10 or the electronic part 20, and the like.

Next, the solder paste P that is supplied onto the solder mask Ms is supplied through the mask openings Mso to the first and second openings 14a and 15a using a squeegee S so that the first and second openings 14a and 15a are filled with the solder paste P as illustrated in FIG. 4B. Thus, the solder paste P with an amount corresponding to the solder storing regions 16 and the mask openings Mso is supplied onto the electrode pads 13. Specifically, the amount of the solder paste P supplied onto the electrode pads 13 is a value obtained by subtracting the volumes of the electrode pads 13 from the sum of the internal volumes of the mask openings Mso, the internal volumes of the first openings 14a and internal volumes of the second openings 15a. Thus, the solder paste P can be supplied onto the electrode pads 13, while the amount of the solder paste P is larger by a value corresponding to the internal volumes of the second openings 15a of the second solder resist 15 than an amount of the solder paste P to be supplied to a circuit board that does not have the second solder resist 15. Thus, the amount of the solder paste P to be supplied onto the electrode pads 13 can be increased without an increase in the thickness of the solder mask Ms.

Next, the solder mask Ms is removed from the circuit board 10 as illustrated in FIG. 4C. In this case, since the thickness of the solder mask Ms is in the range of 120 μm to 150 μm and thin, the solder paste P does not remain in the mask openings Mso and remains on the electrode pads 13 of the circuit board 10.

Next, the lead terminals 22S and 22L of the electronic part 20 are placed on the solder paste P supplied onto the electrode pads 13, as illustrated in FIG. 5A. In this case, among the plurality of lead terminals 22S and 22L, the lead terminal 22L that is in contact with the solder paste P, and the lead terminal 22S that is not in contact with the solder paste P, exist.

Next, as illustrated in FIG. 5B, the circuit board 10 that has the electronic pat 20 mounted thereon is heated, for example, in a reflow furnace so that solder particles (not illustrated) contained in the solder paste P are melted. When the solder particles are melted, the solder paste P flows. Thus, the lead terminal 22L that is placed on the solder paste P sinks owing to the weight of the electronic part 20. In this case, the lead terminal 22S that is not in contact with the solder paste P also sinks owing to the weight of the electronic part 20. In addition, the melted solder particles cohere onto the electrode pads 13 owing to surface tensions of the solder particles, and are elevated toward the side of the lead terminals 22S and 22L of the electronic part 20. Thus, the lead terminals 22S and 22L of the electronic part 20 are incorporated by the melted solder particles and electrically connected to the electrode pads 13 through the melted solder particles. In this case, the solder paste P with the amount that is larger by the amount corresponding to the internal volumes of the second openings 15a of the second solder resist 15 is supplied onto the electrode pads 13. Thus, the melted solder particles are sufficiently elevated. Thus, even if the variation in height of the lead terminals 22S and 22L is equal to or larger than 150 μm, the lead terminals 22S and 22L can be reliably connected to the electrode pads 13. Thus, even if the lead terminals 22S and 22L fail to be connected to a circuit board that does not have the second solder resist 15, the lead terminals 22S and 22L can be connected to the electrode pads 13. The melted solder particles are naturally or forcibly cooled and hardened by cooling so as to form the aforementioned solder member 30.

In the present embodiment, the second solder resist 15 that has the second openings 15a is formed on the first solder resist 14 having the first openings 14a, while the second openings 15a are larger than the first openings 14a. It is, thus, possible to supply, onto the electrode pads 13, the solder paste P with an amount necessary to accommodate the variation in height of the lead terminals 22S and 22L, while suppressing the total thickness of the first and second solder resists 14 and 15 and protecting the surface of the circuit board 10.

When the thickness of a conventional solder resist is simply increased, the amount of the solder paste P can be increased. However, the thickness of the conventional solder resist is limited as described above. Thus, it is important to increase the amount of the solder paste P while the thickness of the conventional solder resist is suppressed. In addition, when the sizes of openings that are formed in the conventional solder resist and cause electrode pads to be exposed are increased, the amount of the solder paste P can be increased. Thus, it is important to increase the amount of the solder paste P while the area of an exposed surface of the circuit board 10 is reduced, in consideration of the protection of the surface of the circuit board 10.

In the present embodiment, the first solder resist 14 that has the first openings 14a has the function of protecting the circuit board 10, while the second solder resist 15 that has the second openings 15a has a function of enabling the amount of the solder paste P to be increased. The second openings 15a are larger than the first openings 14a.

In the present embodiment, the thicknesses of the first and second solder resists 14 and 15 are equal to or close to each other. However, the invention is not limited to this. For example, the thickness of the second solder resist 15 may be larger than the thickness of the first solder resist 14. The second openings 15a are larger than the first openings 14a. Thus, when the thickness of the second solder resist 15 is larger than the thickness of the first solder resist 14, the amount of the solder paste P to be supplied onto the electrode pads 13 can be efficiently increased.

[Second Embodiment]

Next, a second embodiment is described with reference to FIGS. 6A and 6B.

Figure 6A:
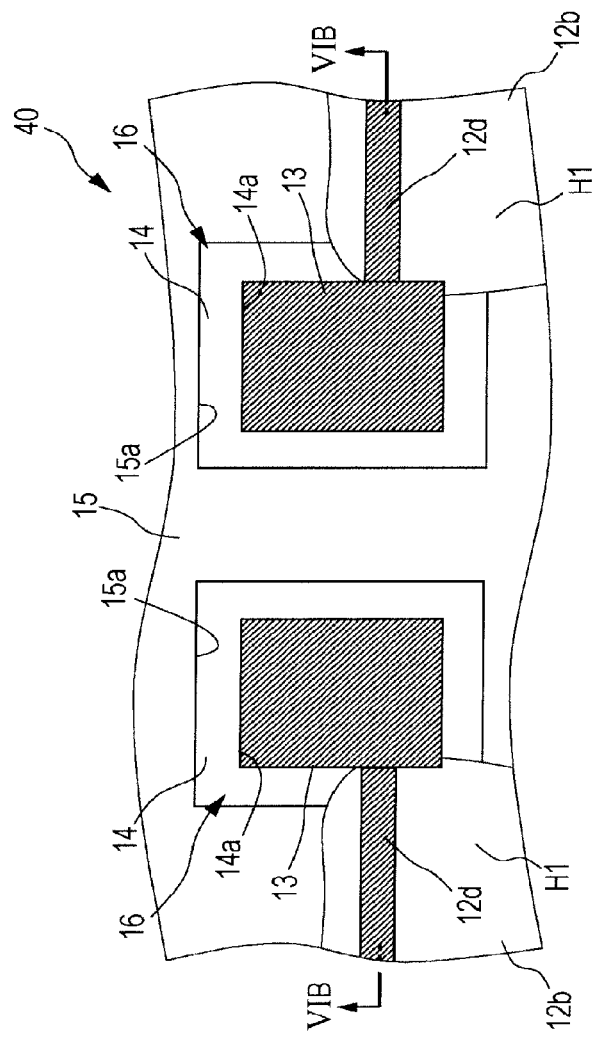
FIGS. 6A and 6B are outline diagrams illustrating a circuit board according to a second embodiment.

FIG. 6A is an outline diagram illustrating a circuit board 40 according to the second embodiment, and illustrates a surface of the circuit board 40. FIG. 6B is an outline diagram illustrating the circuit board 40 according to the second embodiment, and illustrates a cross section of the circuit board 40, taken along line VIB-VIB illustrated in FIG. 6A. A fracture region H1 that is illustrated in FIG. 6A indicates a region in which the second solder resist 15 is removed from the circuit board 40.

Figure 6B:
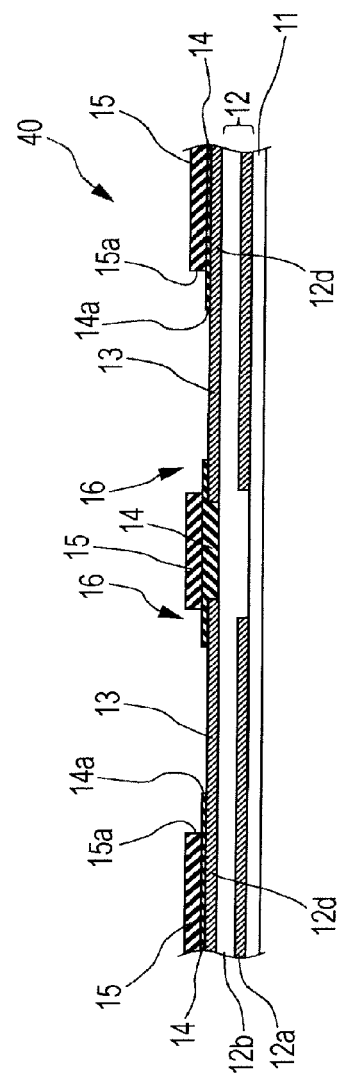

As illustrated in FIGS. 6A and 6B, the circuit board 40 according to the second embodiment further has a wiring pattern 12d on the insulating layer 12b of the circuit board 10 according to the first embodiment. The wiring pattern 12d is formed by patterning a metal foil (or the like) attached to the insulating layer 12b. Metal such as copper or aluminum may be used as a material of the wiring pattern 12d, for example. The first solder resist 14 is arranged on the wiring pattern 12d and the insulating layer 12b and has the first openings 14a on the wiring pattern 12d. The first openings 14a cause parts of the wiring pattern 12d to be exposed. The exposed parts of the wiring pattern 12d form the electrode pads 13. Thus, the electrode pads 13 are defined by the first openings 14a.

Even when the electrode pads 13 are defined by the first openings 14a of the first solder resist 14, the solder paste P with the amount that is larger by the amount corresponding to the internal volumes of the second openings 15a of the second solder resist 15 can be supplied onto the electrode pads 13. Therefore, the lead terminals 22S and 22L that significantly vary in height can be connected to the electrode pads 13 in the same manner as the first embodiment.

[Third Embodiment]

Next, a third embodiment is described with reference to FIGS. 7A and 7B.

FIGS. 7A and 7B are outline diagrams illustrating an electronic device according to the third embodiment. In FIGS. 7A and 7B, an illustration of a detailed structure of a circuit board 41 is omitted.

As illustrated in FIGS. 7A and 7B, the electronic device according to the third embodiment has the electronic part 20 and an electronic part 50, while the electronic part 20 and the electronic part 50 are mounted on the circuit board 41. The circuit board 41 is formed by adding a region for mounting the electronic part 50 to the circuit board 10 according to the first embodiment.

The electronic part 50 includes a part body 51 and a plurality of terminals 52. The terminals 52 of the electronic part 50 are connected to electrode pads 53 through a solder member 54, respectively, while the electrode pads 53 are formed in mounting regions of the circuit board 41. The electronic part 50 is not limited and may be a passive part (such as a resistive element or a capacitor) or an active part (such as a transistor), for example.

In order to supply the solder paste P onto the electrode pads 53, a solder mask (not illustrated) is used. As the solder mask to be used to supply the solder paste P onto the electrode pads 53, a solder mask that is formed by adding, to the solder mask Ms used in the first embodiment, openings to be used to supply the solder paste P onto the electrode pads 53 may be used. The thickness of the solder mask is in a range of 120 μm to 150 μm, like the solder mask Ms. Thus, when the solder mask is pressed against the circuit board 41, the solder mask warps owing to an irregularity of the circuit board 41. Therefore, the solder paste P can be supplied onto the electrode pads 53 only by pressing the solder mask against the circuit board 41 and performing squeezing.

When the plurality types of the electronic parts are to be mounted on the circuit board 41, the second solder resist 15 may be formed only in a region for mounting the electronic part 20, as illustrated in FIG. 7A. When the second solder resist 15 is formed only in the region for mounting the electronic part 20 that has the lead terminals 22S and 22L varying in height in an unacceptable range, the amount of the material of the second solder resist 15 can be reduced to the minimum amount. However, when at least the electronic part 20 that has the lead terminals 22S and 22L varying in height in the unacceptable range is mounted as illustrated in FIG. 7B, the second solder resist 15 may be formed both in the region for mounting the electronic part 20 and the region for mounting the electronic part 50.

[Fourth Embodiment]

Next, a fourth embodiment is described with reference to FIGS. 8A to 10.

Figure 9A:
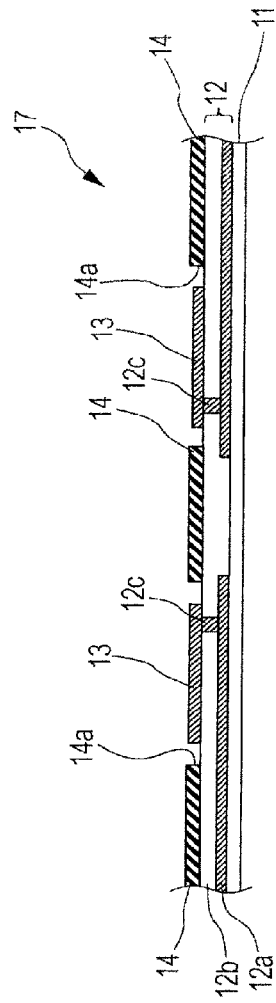
FIGS. 9A to 9C are diagrams illustrating the process of manufacturing the circuit board according to the fourth embodiment.
Figure 9B:
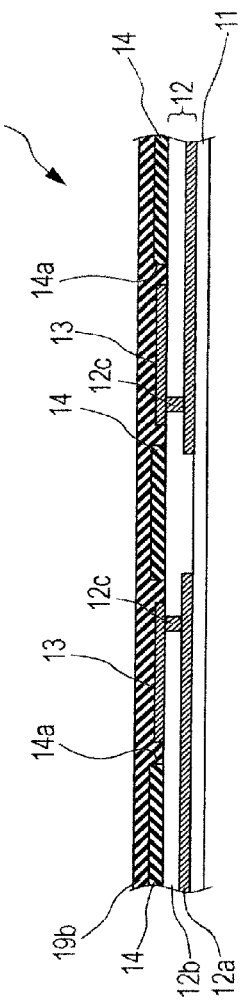
Figure 9C:
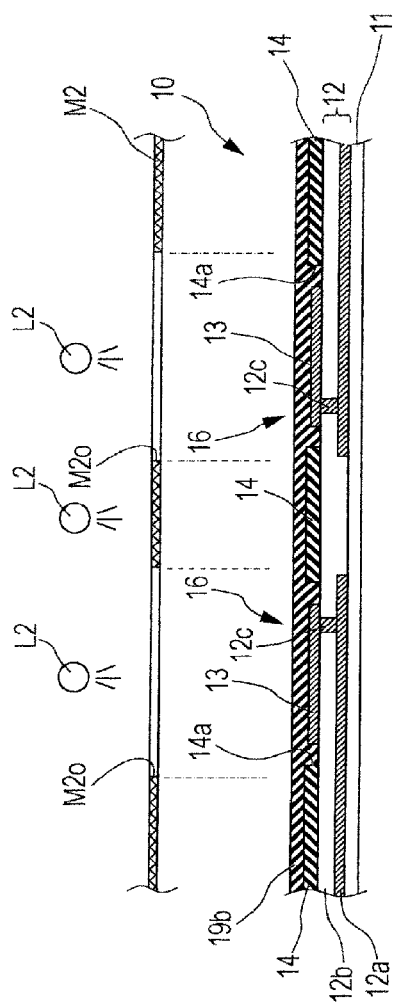
Figure 10:
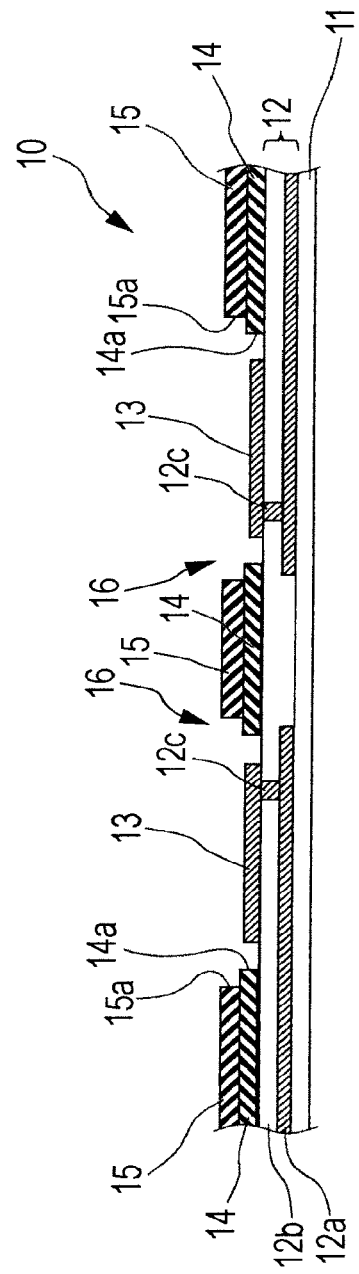
FIG. 10 is a diagram illustrating the process of manufacturing the circuit board according to the fourth embodiment.

FIGS. 8A to 8C are diagrams illustrating a method for manufacturing a circuit board according to the fourth embodiment. FIGS. 9A to 9C are diagrams illustrating the method for manufacturing the circuit board according to the fourth embodiment. FIG. 10 is a diagram illustrating the method for manufacturing the circuit board according to the fourth embodiment.

As illustrated in FIG. 8A, the board 17 is first prepared. The board 17 is formed by removing the first and second solder resists 14 and 15 from the circuit board 10.

Next, as illustrated in FIG. 8B, a liquid photoresist material is supplied onto the surface of the board 17 so as to form a first photoresist film 19a. As the photoresist material, a photosensitive polyimide resin may be used. As a method for supplying the photoresist material, a spray method may be used. The first photoresist film 19a may be heated when necessary. In this case, a heating temperature may be set to 80° C. and a time period for the heating may be set to a range of 20 minutes to 30 minutes, for example. The thickness of the first photosensitive film 19a is in a range of 1 μm to 45 μm, for example.

Next, the first photosensitive film 19a is exposed using a first photomask M1 as illustrated in FIG. 8C. In FIG. 8C, a symbol L1 indicates light sources for exposure. The first photomask M1 has translucent mask openings M1o. The mask openings M1o are placed at positions corresponding to the electrode pads 13 when the first photomask M1 is positioned above the board 17. The mask openings M1*o* are each formed in a rectangular shape that is larger than the electrode pads 13. Thus, When the first photoresist film 19*a* is exposed using the first photomask M1, the first photoresist film 19*a* is irradiated with light that has passed through the mask openings M1*o* so that exposed patterns (not illustrated) that are each formed in a shape corresponding to each of the first openings 14*a* of the first solder resist 14 and each have a size corresponding to each of the first openings 14*a* of the first solder resist 14 are formed on the first photoresist film 19*a*.

Next, as illustrated in FIG. 9A, a developer is supplied to the first photoresist film 19*a* so that an unexposed region of the first photoresist film 19*a* is removed. Thus, the first solder resist 14 is formed on the board 17. The developer may be selected on the basis of the material of the first photoresist film 19*a*. For example, an alkaline aqueous solution may be used as the developer. Then, the first solder resist 14 is heated. In this case, a heating temperature and a time period for the heating are set so that the first photoresist film 19*a* does not have photosensitivity. In the present embodiment, the heating temperature is in a range of 100° C. to 200° C., and the time period for the heating is in a range of 50 minutes to 60 minutes.

Next, as illustrated in FIG. 9B, a liquid photoresist material is supplied onto a surface of the first solder resist 14 so as to form a second photoresist film 19*b*. As the photoresist material, a photosensitive polyimide resin may be used. As a method for supplying the photoresist material, a spray method may be used. The second photoresist film 19*b* may be heated when necessary. In this case, a heating temperature may be set to 80° C., and a time period for the heating may be set to a range of 20 minutes to 30 minutes. The thickness of the second photoresist film 19*b* is in a range of 1 μm to 45 μm, for example.

The thicknesses of the first and second photoresist films 19*a* and 19*b* are determined so that the total thickness of the first and second photoresist films 19*a* and 19*b* is in a range of 10 μm to 50 μm.

Next, as illustrated in FIG. 9C, the second photoresist film 19*b* is exposed using a second photomask M2. In FIG. 9C, a symbol L2 indicates light sources for exposure. The second photomask M2 has translucent mask openings M2*o*. The mask openings M2*o* are placed at positions corresponding to the mask openings M1*o* of the first photomask M1 when the second photomask M2 is positioned above the board 17. The mask openings M2*o* are each formed in a rectangular shape that is larger than the mask openings M1*o* of the first photomask M1. Thus, when the second photoresist film 19*b* is exposed using the second photomask M2, the second photoresist film 19*b* is irradiated with light that has passed through the mask openings M2*o* so that exposed patterns (not illustrated) that are each formed in a shape corresponding to each of the second openings 15*a* of the second solder resist 15 and each have a size corresponding to each of the second openings 15*a* of the second solder resist 15 are formed on the second photoresist film 19*b*.

Next, as illustrated in FIG. 10, a developer is supplied to the second photoresist film 19*b* so that an unexposed region of the second photoresist film 19*b* is removed. In this case, since the first solder resist 14 does not have photosensitivity, the first solder resist 14 is not deformed. The second solder resist 15 is formed on the first solder resist 14. The developer may be selected on the basis of the photoresist material of the second photoresist film 19*b*. For example, an alkaline aqueous solution may be used as the developer. Then, the second solder resist 15 is heated. In this case, a heating temperature and a time period for the heating are set so that the second photoresist film 19*b* does not have photosensitivity. In the present embodiment, the heating temperature is in a range of 100° C. to 200° C., and the time period for the heating is in a range of 50 minutes to 60 minutes. The circuit board 10 according to the present embodiment is manufactured by the manufacturing process described above.

When the first and second solder resists 14 and 15 are formed by photolithography as described above, the sizes and shapes of the first and second openings 14*a* and 15*a* can be set with high accuracy. Thus, a variation in the amount of the solder paste P to be supplied can be suppressed.

[Fifth Embodiment]

Next, a fifth embodiment is described with reference to FIGS. 11A, 11B, 12A and 12B.

Figure 11A:
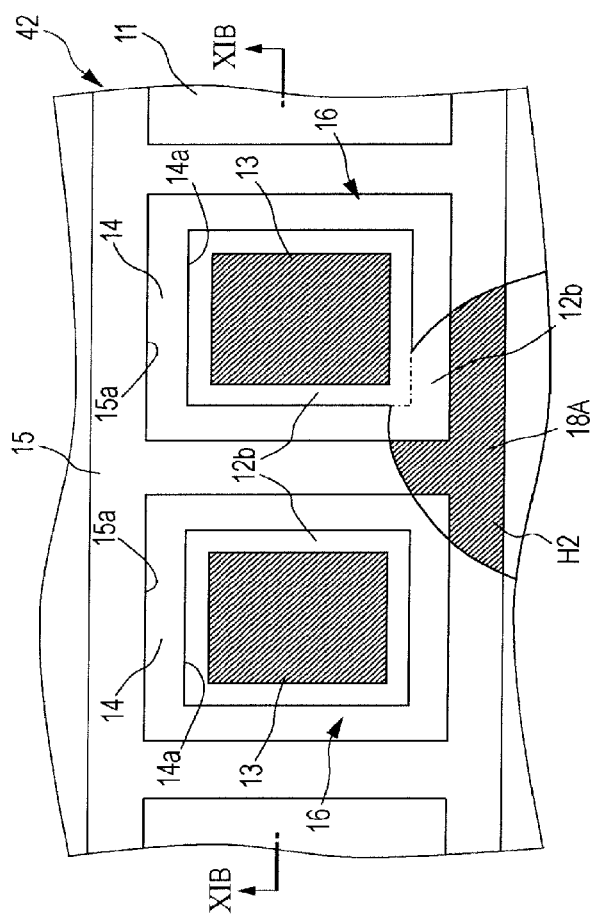
FIGS. 11A and 11B are outline diagrams illustrating a circuit board according to a fifth embodiment.
Figure 11B:
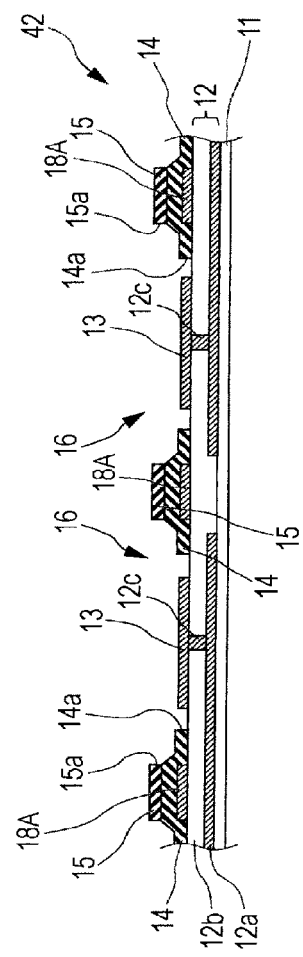
Figure 12A:
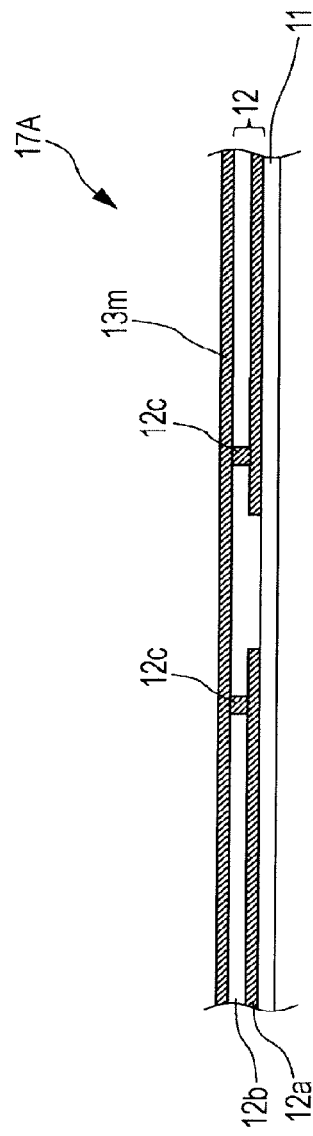
FIGS. 12A and 12B are diagrams illustrating a process of manufacturing the circuit board according to the fifth embodiment.
Figure 12B:
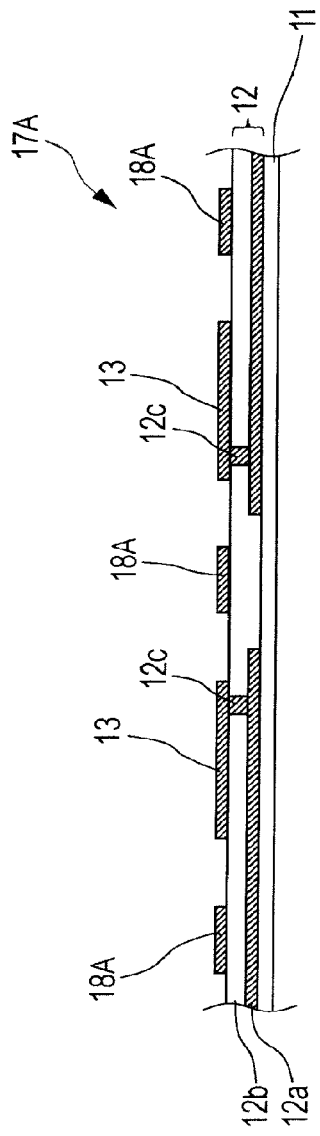

FIG. 11A is an outline diagram illustrating a circuit board 42 according to the fifth embodiment and illustrates a surface of the circuit board 42. FIG. 11B is an outline diagram illustrating the circuit board 42 according to the fifth embodiment and illustrates a cross section of the circuit board 42, taken along line XIB-XIB illustrated in FIG. 11A. A fracture region H2 that is illustrated in FIG. 11A indicates a region in which the first and second solder resists 14 and 15 are removed from the circuit board 42. FIGS. 12A and 12B are diagrams illustrating a process of manufacturing the circuit board according to the fifth embodiment.

As illustrated in FIGS. 11A and 11B, the circuit board 42 according to the fifth embodiment has a dummy pattern (pattern) 18A on the insulating layer 12*b*. The first solder resist 14 is formed on the dummy pattern 18A. The second solder resist 15 is formed on the first solder resist 14. The dummy pattern 18A is formed in a ladder shape in plan view so that the electrode pads 13 are surrounded by frame portions of the dummy pattern 18A. The thickness of the dummy pattern 18A is, for example, in a range of 40 μm to 60 μm, in the same manner as the electrode pads 13. The size and shape of the dummy pattern 18A in plan view may be the same as the size and shape of the second solder resist 15 in plan view. As a material of the dummy pattern 18A, metal such as copper or aluminum may be used in the same manner as the electrode pads 13. When a material that is the same as the electrode pads 13 is used as the material of the dummy pattern 18A, a metal film 13*m* is formed on the insulating layer 12*b* of the wiring multilayer 12 as illustrated in FIG. 12A, and the electrode pads 13 and the dummy pattern 18A are simultaneously patterned by etching the metal film 13*m* after the formation of the metal film 13*m* as illustrated in FIG. 12B. Thus, the manufacturing process can be simplified without adding another manufacturing process. It should be noted that a dummy pattern 18B (described later) according to a sixth embodiment may be formed in the same manner as the dummy pattern 18A.

In the fifth embodiment, since the first solder resist 14 is formed on the dummy pattern 18A and the second solder resist 15 is formed on the first solder resist 14, the surface of the first solder resist 14 is higher by the thickness of the dummy pattern 18A than the surfaces of the electrode pads 13, and the surface of the second solder resist 15 is higher by the thickness of the dummy pattern 18A and the thickness of the first solder resist 14 than the surfaces of the electrode pads 13. Thus, the solder paste P with a larger amount can be supplied on to the electrode pads 13, compared with the amount of the solder paste P to be supplied to the circuit board 10 according to the first embodiment.

[Sixth Embodiment]

Next, the sixth embodiment is described with reference to FIGS. 13A and 13B.

FIG. 13A is a plan view of a circuit board 43 according to the sixth embodiment and illustrates a surface of the circuit board 43. FIG. 13B is a plan view of the circuit board 43 according to the sixth embodiment and illustrates a cross section of the circuit board 43, taken along line XIIIB-XIIIB illustrated in FIG. 13A. A fracture region H3 that is illustrated in FIG. 13A indicates a region in which the first and second solder resists 14 and 15 are removed from the circuit board 43.

As illustrated in FIGS. 13A and 13B, the circuit board 43 according to the sixth embodiment further has a wiring pattern 12e on the insulating layer 12b of the circuit board 42 according to the fifth embodiment. The wiring pattern 12e is formed by patterning a metal foil attached to a surface of the insulating layer 12b, for example. As a material of the wiring pattern 12e, metal such as copper or aluminum may be used. The first solder resist 14 is arranged on the wiring pattern 12e and the insulating layer 12b. The first openings 14a are formed on the wiring pattern 12e. The first openings 14a cause parts of the wiring pattern 12e to be exposed so that the exposed parts of the wiring pattern 12e form the electrode pads 13. Thus, the electrode pads 13 are defined by the first openings 14a. The dummy pattern 18B has discontinuous portions S at positions corresponding to parts of the wiring pattern 12e so that the parts of the wiring pattern 12e extend from the electrode pads 13 to the outside of the dummy pattern 18B. Thus, the dummy pattern 18B does not need to be continuous. When the dummy pattern 18B has the discontinuous portions S, and gaps between the wiring pattern 12e and the dummy pattern 18B are small, the height of the second solder resist 15 is not affected. Thus, the solder paste P with a larger amount can be supplied onto the electrode pads 13, similarly to the fifth embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
    a circuit board;
    a first electronic component mounted on a first region of the circuit board and including a plurality of first terminals; and
    a second electronic component mounted on a second region of the circuit board and including a plurality of second terminals; and
    wherein the circuit board includes;
        a board body,
        a plurality of first electrode pads arranged on the board body, each of the first electrode pads being connected to each of the first terminals by solder,
        a plurality of second electrode pads arranged on the board body, each of the second electrode pads being connected to each of the second terminals by solder,
        a first solder resist formed on the board body and having a plurality of first openings and a plurality of second openings, each of the first openings accommodating each of the first electrode pads and each of the second openings accommodating each of the second electrode pads, and
        a second solder resist selectively formed on the first solder resist and having a plurality of third openings, each of the third openings being larger than each of the first openings and communicating with each of the first openings.

2. A circuit board comprising:
    a board body;
    a plurality of first electrode pads arranged on the board body;
    a plurality of second electrode pads arranged on the board body;
    a first solder resist formed on the board body and having a plurality of first openings and a plurality of second openings, each of the first openings accommodating each of the first electrode pads and each of the second openings accommodating each of the second electrode pads; and
    a second solder resist formed on the first solder resist and having a plurality of third openings, each of the third openings being larger than each of the first openings and communicating with each of the first openings,
    wherein the board body includes a first region on which a first electronic component is mounted and a second region on which a second electronic component is mounted, and
    the second solder resist is selectively formed in the first region.

* * * * *